US006725159B2

(12) United States Patent
Krasner

(10) Patent No.: US 6,725,159 B2
(45) Date of Patent: Apr. 20, 2004

(54) GPS RECEIVER AND METHOD FOR PROCESSING GPS SIGNALS

(75) Inventor: Norman F. Krasner, San Carlos, CA (US)

(73) Assignee: Snaptrack Incorporated, San Jose, CA (US)

( * ) Notice: Subject to any disclaimer, the term of this patent is extended or adjusted under 35 U.S.C. 154(b) by 0 days.

(21) Appl. No.: 10/340,015

(22) Filed: Jan. 9, 2003

(65) Prior Publication Data

US 2003/0139879 A1 Jul. 24, 2003

Related U.S. Application Data

(63) Continuation of application No. 09/882,313, filed on Jun. 14, 2001, now Pat. No. 6,542,821, which is a continuation of application No. 09/136,011, filed on Aug. 17, 1998, now Pat. No. 6,272,430, which is a continuation of application No. 08/708,551, filed on Sep. 6, 1996, now Pat. No. 5,884,214.

(51) Int. Cl.[7] .............................................. G06F 17/00
(52) U.S. Cl. ...................................... 701/213; 342/357
(58) Field of Search ................................ 701/213, 214, 701/207, 200; 73/178 R; 342/357, 422

(56) References Cited

U.S. PATENT DOCUMENTS

| 4,445,118 A | 4/1984 | Taylor et al. ................ 343/357 |
| 4,457,006 A | 6/1984 | Maine ......................... 375/87 |

(List continued on next page.)

FOREIGN PATENT DOCUMENTS

DE    4424 412    1/1996

(List continued on next page.)

OTHER PUBLICATIONS

–Rothblatt, Martin, "The First GPS Satellite Radio Optimized for Automatic Vehicle Location", *500 Years After Columbus–Navigation* . . . , pp. 524–527, Mar. 23–27, 1992.

(List continued on next page.)

*Primary Examiner*—Willaim A. Cuchlinski, Jr.
*Assistant Examiner*—Olga Hernandez
(74) *Attorney, Agent, or Firm*—Philip Wadsworth; Charles Brown; Bruce Greenhaus

(57) ABSTRACT

A global positioning system (GPS) receiver has first circuitry for receiving and processing pseudorandom sequences transmitted by a number of GPS satellites. The first circuitry is configured to perform conventional correlation operations on the received pseudorandom sequences to determine pseudoranges from the GPS receiver to the GPS satellites. The GPS receiver also includes second circuitry coupled to the first circuitry. The second circuitry is configured to receive and process the pseudorandom sequences during blockage conditions. The second circuitry processes the pseudorandom sequences by digitizing and storing a predetermined record length of the received sequences and then performing fast convolution operations on the stored data to determine the pseudoranges. The GPS receiver may have a common circuitry for receiving GPS signals from in view satellites and downconverting the RF frequency of the received GPS signals to an intermediate frequency (IF). The IF signals are split into two signal paths; a first of which provides the conventional con-elation processing to calculate the pseudoranges. During blockage conditions, the IF signal is passed to the second signal path wherein the IF signals are digitized and stored in memory and later processed using the fast convolution operations to provide the pseudoranges. Alternative arrangements for the two signal paths include separate downconverters or shared digitizers. One embodiment provides both signal paths on a single integrated circuit with shared circuitry executing computer readable instructions to perform GPS signal processing appropriate to the reception conditions.

36 Claims, 6 Drawing Sheets

U.S. PATENT DOCUMENTS

| | | |
|---|---|---|
| 4,601,005 A | 7/1986 | Kilvington .................... 364/602 |
| 4,701,934 A | 10/1987 | Jasper ............................ 375/1 |
| 4,785,463 A | 11/1988 | Jane et al. ...................... 375/1 |
| 4,797,677 A | 1/1989 | MacDoran et al. ......... 342/352 |
| 4,959,656 A | 9/1990 | Kumar ........................ 342/418 |
| 4,998,111 A | 3/1991 | Ma et al. ..................... 342/352 |
| 5,043,736 A | 8/1991 | Darnell et al. ............... 342/357 |
| 5,119,102 A | 6/1992 | Barnard ....................... 342/357 |
| 5,153,598 A | 10/1992 | Alves, Jr. .................... 342/352 |
| 5,202,829 A | 4/1993 | Geier ........................... 364/449 |
| 5,223,844 A | 6/1993 | Mansell et al. ............. 342/357 |
| 5,225,842 A | 7/1993 | Brown et al. ................ 342/357 |
| 5,245,634 A | 9/1993 | Averbuch .................... 375/108 |
| 5,271,034 A | 12/1993 | Abaunza ......................... 375/1 |
| 5,311,194 A | 5/1994 | Brown ......................... 342/357 |
| 5,317,323 A | 5/1994 | Kennedy et al. ............ 342/457 |
| 5,323,163 A | 6/1994 | Maki ........................... 342/357 |
| 5,323,322 A | 6/1994 | Mueller et al. .............. 364/449 |
| 5,329,549 A | 7/1994 | Kawasaki ........................ 375/1 |
| 5,365,450 A | 11/1994 | Schuchman et al. ........ 364/449 |
| 5,379,047 A | 1/1995 | Yokev et al. ................ 342/457 |
| 5,379,224 A | 1/1995 | Brown et al. ................ 364/449 |
| 5,379,320 A | 1/1995 | Fernandes et al. .............. 375/1 |
| 5,416,797 A | 5/1995 | Gilhousen et al. .......... 375/705 |
| 5,418,538 A * | 5/1995 | Lau .............................. 342/357 |
| 5,420,592 A | 5/1995 | Johnson ....................... 342/357 |
| 5,430,759 A | 7/1995 | Yokev et al. ................ 375/202 |
| 5,448,773 A | 9/1995 | McBurney et al. .......... 455/343 |
| 5,483,549 A | 1/1996 | Weinberg et al. ........... 375/200 |
| 5,491,486 A | 2/1996 | Welles, II et al. ........... 342/357 |
| 5,663,734 A | 9/1997 | Krasner ....................... 342/357 |
| 5,831,574 A | 11/1998 | Krasner ....................... 342/357 |
| 5,841,396 A | 11/1998 | Krasner ....................... 342/357 |
| 5,884,214 A | 3/1999 | Krasner ........................ 701/21 |
| 5,999,124 A * | 12/1999 | Sheynblat ............... 342/357.01 |
| 6,064,336 A * | 5/2000 | Krasner ................. 342/357.05 |
| 6,104,340 A * | 8/2000 | Krasner .................... 342/357.1 |
| 6,133,874 A * | 10/2000 | Krasner ................. 342/357.09 |
| 6,215,441 B1 * | 4/2001 | Moeglein et al. ....... 342/357.01 |
| 6,272,430 B1 * | 8/2001 | Krasner ................. 342/357.06 |
| 6,311,129 B1 * | 10/2001 | Lin .............................. 342/422 |
| 6,331,835 B1 * | 12/2001 | Gustafson et al. ..... 342/357.01 |
| 6,347,113 B1 * | 2/2002 | Hatch .......................... 375/149 |

FOREIGN PATENT DOCUMENTS

| | | |
|---|---|---|
| EP | 0 444 738 | 9/1991 |
| EP | 0447978 | 9/1991 |
| EP | 0545363 | 6/1993 |
| EP | 0635728 A1 | 1/1995 |
| GB | 2273218 | 6/1994 |
| GB | 2308033 | 6/1997 |
| WO | WO9428434 | 12/1994 |
| WO | WO 96/15636 | 5/1996 |
| WO | WO 97/14049 | 4/1997 |
| WO | WO9740398 | 10/1997 |

OTHER PUBLICATIONS

–Davenport, Robert G., "FFT Processing of Direct Sequence Spreading Codes Using Modem . . . " *Proceedings of the IEEE 1991 National Aerospace and Electronics . . .*, vol. 1, pp. 98–105, May vol. 1, pp. 98–105, May 20–24, 1991.

"RTCM Recommended Standards for Differential Navstar GPS Service, Version 2.0" Radio Technical Commission for Maritime Services, Jan. 1, 1990.

"Animal–borne GPS: Tracking the Habitat", Rogers & Anson, GPS World, pp. 21, 22, Jul., 1994.

"Navstar GPS User Equipment, Introduction", NATO, Feb. 1991.

"Loran–C Vehicle Tracking in Detroit's Public Safety Dispatch System", Laurence J. Cortland, vol. 36, No. 3 Journal of Institute of Navigation, Fall 1989.

"Navigation Journal of the Institute of Navigation, vol. 25, No. 2" The Institute of Navigation, 1978 (entire edition).

"GPS Receiver Structures", Petterson et al., ION–GPS–95, Session C4, Land Vehicular Applications, Palm Springs, CA Sep. 1995.

"An Application of the Global Positioning System to Search and Rescue and Remote Tracking", Raab, et al. Navigation Journal of Institue of Navigation, vol. 24, No. 3, 1977.

* cited by examiner

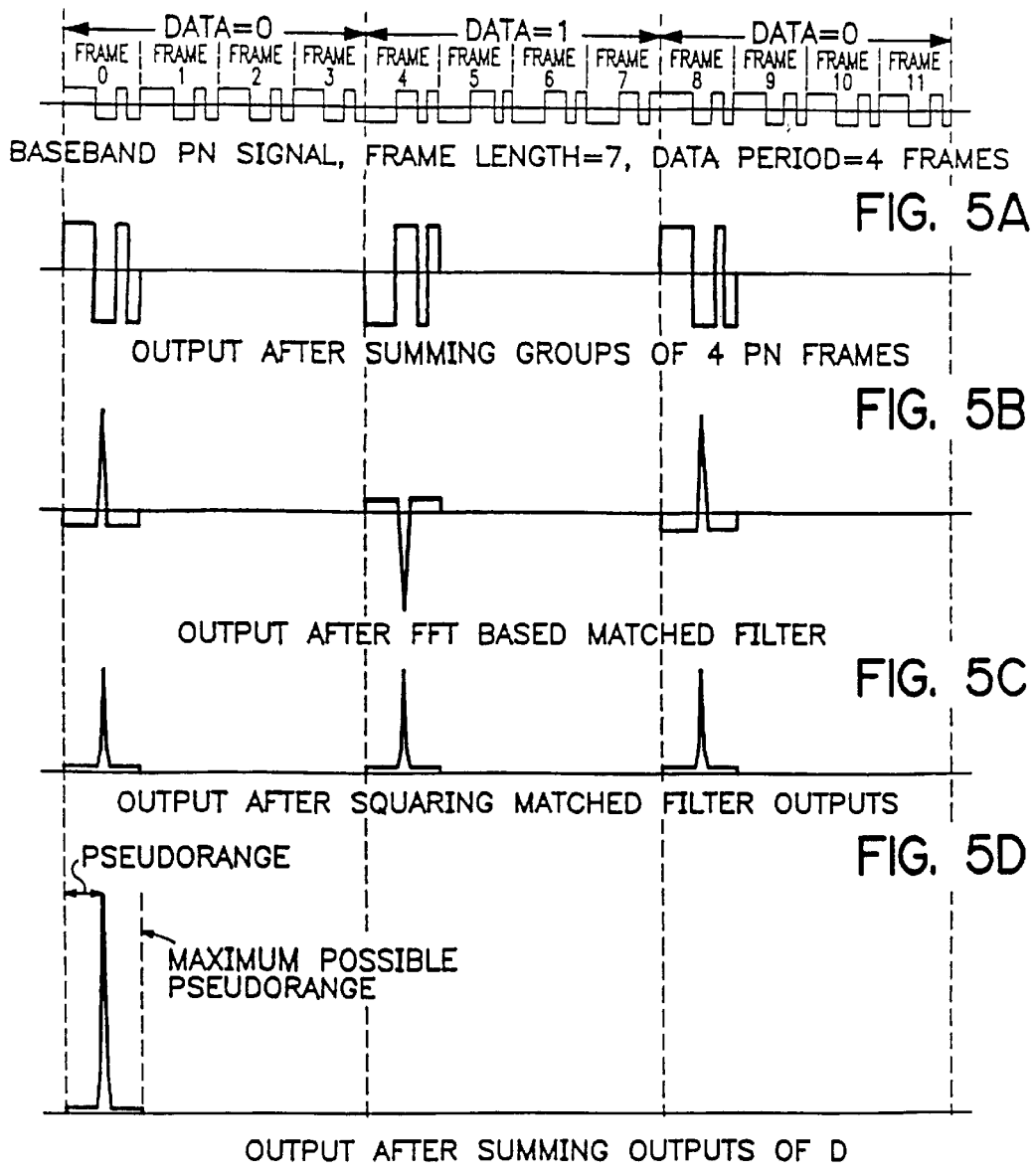

GPS RECEIVER AND METHOD FOR PROCESSING GPS SIGNALS

RELATED APPLICATIONS

This application is related to and hereby claims the benefit of the filing date of a provisional patent application by the same inventor, Norman F. Krasner, which application is entitled Low Power, Sensitive Pseudorange Measurement Apparatus and Method for Global Positioning Satellites Systems, Ser. No. 60/005,318, filed Oct. 9, 1995. This application is a continuation of U.S. patent application Ser. No. 09/882,313, filed Jun. 14, 2001, now U.S. Pat. No. 6,542,721, which is a continuation of co-pending U.S. patent application Ser. No. 09/136,011, filed Aug. 17, 1998, now U.S. Pat. No. 6,272,430, which is a continuation of U.S. patent application Ser. No. 08/708,551, which was filed Sep. 6, 1996, now U.S. Pat. No. 5,884,214. This application is related to U.S. patent application Ser. No. 09/138,946, now U.S. Pat. No. 6,104,340.

FIELD OF THE INVENTION

The present invention concerns receivers capable of determining pseudoranges to orbiting satellites and, in particular, concerns such receivers as find application in global positioning satellite systems (GPS).

BACKGROUND

GPS receivers normally determine their position by computing relative times of arrival of signals transmitted simultaneously from a multiplicity of GPS (or NAVSTAR) satellites. These satellites transmit, as part of their message, both satellite positioning data as well as data on clock timing, so-called "ephemeris" data. The process of searching for and acquiring GPS signals, reading the ephemeris data for a multiplicity of satellites and computing the location of the receiver from this data is time consuming, often requiring several minutes. In many cases, this lengthy processing time is unacceptable and, furthermore, greatly limits battery life in micro-miniaturized portable applications.

Another limitation of current GPS receivers is that their operation is limited to situations in which multiple satellites are clearly in view, without obstructions, and where a good quality antenna is properly positioned to receive such signals. As such, they normally are unusable in portable, body mounted applications; in areas where there is significant foliage or building blockage (e.g., urban canyons); and in in-building applications.

There are two principal functions of GPS receiving systems: (1) computation of the pseudoranges to the various GPS satellites, and (2) computation of the position of the receiving platform using these pseudoranges and satellite timing and ephemeris data. The pseudoranges are simply the time delays measured between the received signal from each satellite and a local clock. The satellite ephemeris and timing data is extracted from the GPS signal once it is acquired and tracked. As stated above, collecting this information normally takes a relatively long time (30 seconds to several minutes) and must be accomplished with a good received signal level in order to achieve low error rates.

Virtually all known GPS receivers utilize correlation methods to compute pseudoranges. GPS signals contain high rate repetitive signals called pseudorandom (PN) sequences. The codes available for civilian applications are called C/A codes and have a binary phase-reversal rate, or "chipping" rate, of 1.023 MHz and a repetition period of 1023 chips for a code period of 1 msec. The code sequences belong to a family known as Gold codes. Each GPS satellite broadcasts a signal with a unique Gold code.

For a signal received from a given GPS satellite, following a downconversion process to baseband, a correlation receiver multiplies the received signal by a stored replica of the appropriate Gold code contained within its local memory, and then integrates, or lowpass filters, the product in order to obtain an indication of the presence of the signal. This process is termed a "correlation" operation. By sequentially adjusting the relative timing of this stored replica relative to the received signal, and observing the correlation output, the receiver can determine the time delay between the received signal and a local clock The initial determination of the presence of such an output is termed "acquisition." Once acquisition occurs, the process enters the "tracking" phase in which the timing of the local reference is adjusted in small amounts in order to maintain a high correlation output. The correlation output during the tracking phase may be viewed as the GPS signal with the pseudorandom code removed, or, in common terminology, "despread." This signal is narrow band, with bandwidth commensurate with a 50 bit per second binary phase shift keyed data signal which is superimposed on the GPS waveform.

The correlation acquisition process is very time consuming, especially if received signals are weak. To improve acquisition time, most GPS receivers utilize a multiplicity of correlators (up to 12 typically) which allows a parallel search for correlation peaks.

Some prior GPS receivers have used FFT techniques to determine the Doppler frequency of the received GPS signal. These receivers utilize conventional correlation operations to despread the GPS signal and provide a narrow band signal with bandwidth typically in the range of 10 kHz to 30 kHz. The resulting narrow band signal is then Fourier analyzed using FFT algorithms to determine the carrier frequency. The determination of such a carrier simultaneously provides an indication that the local PN reference is adjusted to the correct phase of the received signal and provides an accurate measurement of carrier frequency. This frequency may then be utilized in the tracking operation of the receivers.

U.S. Pat. No. 5,420,592 to Johnson discusses the use of FFT algorithms to compute pseudoranges at a central processing location rather than at a mobile unit. According to that method, a snapshot of data is collected by a GPS receiver and then transmitted over a data link to a remote receiver where it undergoes FFT processing. However, the method disclosed therein computes only a single forward and inverse Fast Fourier Transform (corresponding to four PN periods) to perform the set of correlations.

SUMMARY

One embodiment of the present invention provides a global positioning system (GPS) receiver having first circuitry for receiving and processing pseudorandom sequences transmitted by a number of GPS satellites. The first circuitry is configured to perform conventional correlation operations on the received pseudorandom sequences to determine pseudoranges from the GPS receiver to the GPS satellites. The GPS receiver also includes second circuitry coupled to the first circuitry. The second circuitry is configured to receive and process the pseudorandom sequences during blockage conditions. The second circuitry processes the pseudorandom sequences by digitizing and storing a predetermined record length of the received sequences and then performs fast convolution operations on the stored data to determine the pseudoranges.

In one embodiment, the GPS receiver has a common antenna for receiving GPS signals from in view satellites; and a common downconverter for reducing the RF frequency of the received GPS signals to an intermediate frequency (IF). The IF signals are then split into two signal paths. A first of the signal paths provides for conventional GPS signal processing using correlation operations to calculate the pseudoranges. During blockage conditions, the IF signal is passed to the second signal path wherein the IF signals are digitized and stored in memory for later processing in the receiver. This later processing is accomplished using a programmable digital signal processor which executes the instructions necessary to perform fast convolution operations on the sampled IF GPS signals to provide the pseudoranges.

In yet another embodiment of the present invention, the GPS receiver has a common antenna for receiving GPS signals from in view satellites and a switch for choosing between two signal paths. A first of the signal paths provides for conventional GPS signal processing, wherein pseudoranges are calculated using correlation operations. During blockage conditions, a second signal path is used wherein the signals are digitized and stored in memory for later processing. This later processing is accomplished using fast convolution operations on the sampled GPS signals to provide the pseudoranges.

A further embodiment of the present invention provides a GPS receiver with a common antenna for receiving GPS signals from in view satellites and a common downconverter and digitizer. Sampled GPS signals received from the in view satellites are provided to a first signal path for conventional correlation processing to determine pseudoranges. During blockage conditions, the sampled GPS signals are provided to a second signal path for processing using fast convolution operations to determine the pseudoranges. The two signal paths may be provided by separate circuitry or by common circuitry executing computer readable instructions appropriate for the given reception conditions.

An additional embodiment of the present invention provides a method for determining the position of a remote GPS receiver by storing GPS satellite information, including Doppler, in the remote unit. During blockage conditions, the remote unit uses this information and sampled GPS signals from in view satellites to subsequently compute pseudoranges to the satellites using fast convolution operations. The computed pseudoranges may then used to determine the position of the remote unit. The position determination can occur at the remote unit or at a basestation. Where the position determination is performed at a basestation, the remote unit transmits the pseudoranges to the basestation via a data link.

BRIEF DESCRIPTION OF THE DRAWINGS

The present invention is illustrated by way of example and not limitation in the figures of the accompanying drawings in which like references indicate similar elements and in which:

FIGS. 5A–5E illustrate signal processing waveforms at various stages of processing in a dual mode GPS receiver according to the present invention.

DETAILED DESCRIPTION

This invention concerns apparatus and methods for computing the position of a mobile, or remote, global positioning system (GPS) receiver with very low received signal levels. As illustrated in FIGS. 1A–1D, a GPS receiver 10 has first circuitry for receiving and processing pseudorandom sequences transmitted by a number of GPS satellites. The first circuitry is configured to perform conventional correlation operations on the received pseudorandom sequences to determine pseudoranges from the GPS receiver to the GPS satellites. Accordingly, the first circuitry is referred to herein as a conventional GPS receiver 12. The GPS receiver 10 also includes second circuitry coupled to the conventional GPS receiver 12. The second circuitry is configured to receive and process the pseudorandom sequences during blockage conditions. Blockage conditions are those conditions where the conventional GPS receiver 12 may have difficulty acquiring and/or tracking GPS signals from GPS satellites, such as occasions where the GPS signals have very low signal to noise ratios, urban canyon conditions where GPS signals are blocked due to tall buildings, tunnels and other obstacles, conditions where the GPS receiver 10 is being operated under cover of trees or other foliage, in building applications where GPS receiver 10 is being operated indoors, and other blockage conditions as will be appreciated by those skilled in the art.

The second circuitry is referred to herein as a snapshot GPS receiver 14 which processes the pseudorandom sequences by digitizing and storing GPS data made up of a predetermined record length of the received pseudorandom sequences. Once the GPS data has been stored, snapshot GPS receiver 14 performs fast convolution operations on the stored data to determine the pseudoranges. The manner in which these computations are performed are discussed in detail below.

Figure 1A:
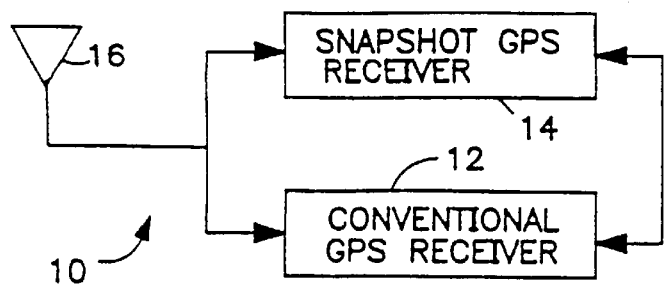
FIGS. 1A–1D are block diagrams of the major components of a remote GPS receiving system utilizing the apparatus and methods of the present invention.
Figure 1B:
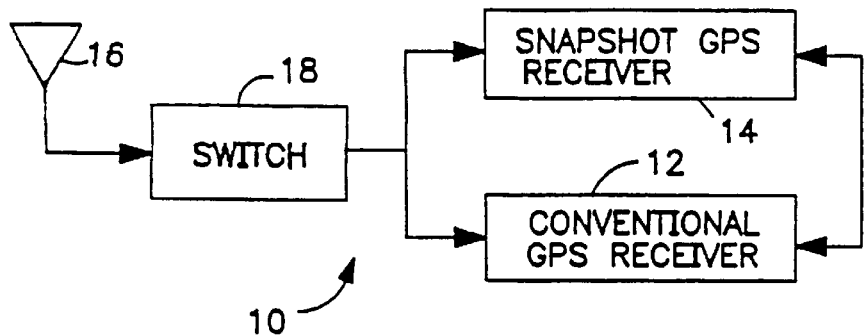

As illustrated in FIGS. 1A–1D, GPS receiver 10 includes two signal paths, corresponding to conventional GPS receiver 12 and snapshot GPS receiver 14. Various embodiments may include common circuitry within these signal paths for receiving GPS signals from in view satellites, downconverting the RF frequency of the received GPS signals to an intermediate frequency (IF) and/or digitizing the received GPS signals. For example, all the embodiments illustrated in FIGS. 1A–1D include a common antenna 16 for receiving GPS signals. However, separate antennas for conventional GPS receiver 12 and snapshot GPS receiver 14 could be used. The embodiment illustrated in FIG. 1B provides a common antenna switch 18 for choosing between the two signal paths. During non-blockage reception conditions, switch 18 will allow received GPS signals to pass from antenna 16 to conventional GPS receiver 12. Then, during blockage conditions, switch 18 will be configured to allow GPS signals to pass from antenna 16 to snapshot GPS receiver 14. As shown in FIG. 1A, however, switch 18 may be omitted and signals from antenna 16 may be provided simultaneously to both conventional GPS receiver 12 and snapshot GPS receiver 14. For such an embodiment, conventional GPS receiver 12 and snapshot GPS receiver 14 will communicate with one another (for example, through the use of a common processor or by passing control information between separate processors) to determine which component will provide paeudorange computation.

Figure 1C:
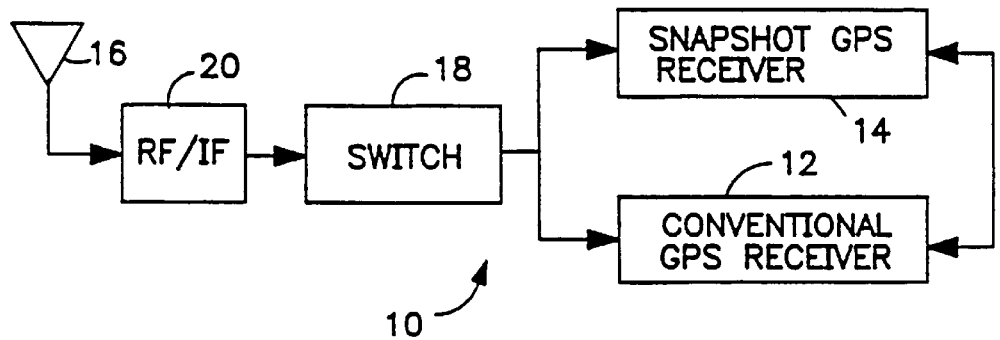

An alternative embodiment, shown in FIG. 1C, provides a common RF to IF downconverter 20 for both signal paths. This embodiment allows for reduced complexity in conventional GPS receiver 12 and snapshot GPS receiver 14. The use of shared circuitry of this type also achieves a space savings for the overall GPS receiver 10. It should be appreciated that although the embodiment of FIG. 1C includes switch 18, the shared RF to IF converter 20 could also be used in the embodiment illustrated in FIG. 1A.

Figure 1D:
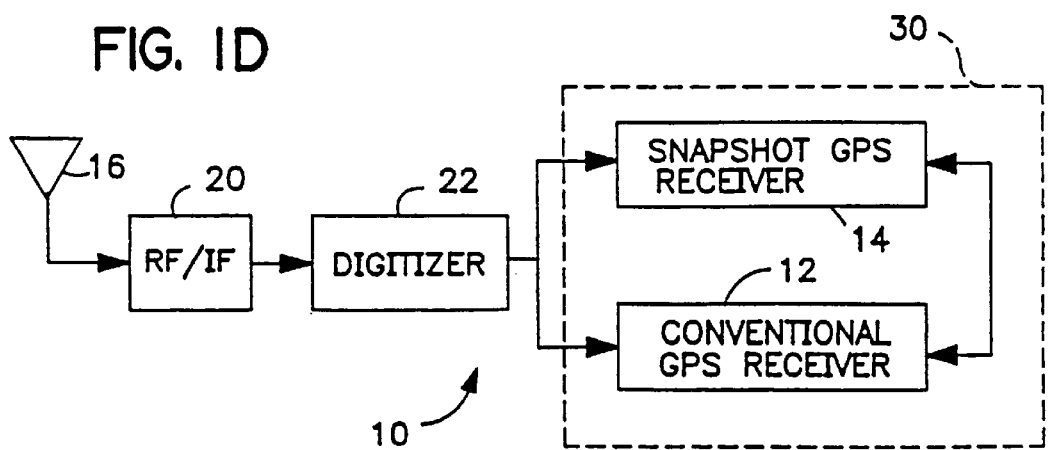

Yet another embodiment of GPS receiver 10 is illustrated in FIG. 1D. in this embodiment, the shared circuitry includes RF to IF converter 20 and digitizer 22. It will be appreciated that for this embodiment, conventional GPS receiver 12 is configured as a digital receiver, that is, a receiver which computed pseudoranges using digital logic in the form of hardware correlators or a programmable signal processor executing appropriate instructions. Both types of conventional GPS receivers are known in the GPS art. Further review of the detailed discussion of the signal processing functions performed by snapshot GPS receiver 14 provided below will demonstrate how such an embodiment can be implemented in accordance with the present invention.

The embodiment of FIG. 1D may have conventional GPS receiver 12 and snapshot GPS receiver 14 as separate functional units (e.g., separate integrated circuits) configured to communicate with one another. Alternatively, these two units may be formed on a single integrated circuit 30 with shared circuitry configured to perform GPS signal processing appropriate to the reception conditions. That is, for non-blockage conditions, the circuitry may be configured to perform conventional GPS signal processing as described above. Then, when blockage conditions are encountered, the circuitry could be configured to perform snapshot GPS signal processing as will be described in detail below. Those skilled in the art will appreciate that these functions could be accomplished with a programmable digital signal processor and appropriate computer readable instructions provided in, for example, a programmable read only memory (PROM) or with specially designed hardware circuitry. In either case, RF to IF downconverter 20 and digitizer 22 may be included on the single integrated circuit 30. However, because such components are commercially available in their separate form today, a presently preferred embodiment of the FIG. 1D implementation uses independent RF to IF downconverter 20 and digitizer 22 as illustrated.

Those skilled in the art will appreciate that FIGS. 1A–1D merely illustrate four of many potential embodiments of the present invention. Variations of these embodiments are possible wherein various circuitry or functions are shared between conventional GPS receiver 12 and snapshot GPS receiver 14. These variations are within the spirit and scope of the present invention. For convenience, the embodiment of FIG. 1C will be chosen for further detailed description below because it illustrates an embodiment with an intermediate level of shared circuitry which may be commercially available. It should further be noted that pseudoranges may be used to compute the geographical position of GPS receiver 10 in many different ways. Three examples are:

Method 1: By retransmitting the Satellite Data Messages to the GPS receiver 10 from a basestation 50, GPS receiver 10 may combine this information with the pseudorange measurements to compute its position. See, for example, U.S. Pat. No. 5,365,450, which is incorporated herein by reference.

Method 2: GPS receiver 10 may gather the satellite ephemeris data from the reception of GPS signals in the normal manner that is commonly practiced in the art using conventional GPS receiver 12. This data, which typically is valid for one to two hours, may be combined with pseudorange measurements from conventional GPS receiver 12 or, during blockage conditions, from snapshot GPS receiver 14 to complete the position calculation.

Method 3: GPS receiver 10 may transmit over a communications link 52 the pseudoranges computed by conventional GPS receiver 12 or snapshot GPS receiver 14 to basestation 50 which can combine this information with the satellite ephemeris data to complete the position calculation. See, for example, U.S. Pat. No. 5,225,842, which is incorporated herein by reference.

Method 2 provides the advantage of allowing GPS receiver 10 to operate in a self-contained manner. That is, no external communications are required. In Methods 1 and 3, basestation 50 requires information regarding the satellites in view of GPS receiver 10. This may be accomplished by knowing approximately the area in which GPS receiver 10 is operating or by ensuring that basestation 50 and GPS receiver 10 have a common view of all satellites of interest and are positioned close enough to one another to resolve a time ambiguity associated with the repetition rate of the GPS pseudorandom codes. This latter condition will be met for a range between basestation 50 and GPS receiver 10 of 1/2 times the speed of light times the PN repetition period (1 millisecond), or about 150 km.

Figure 2:
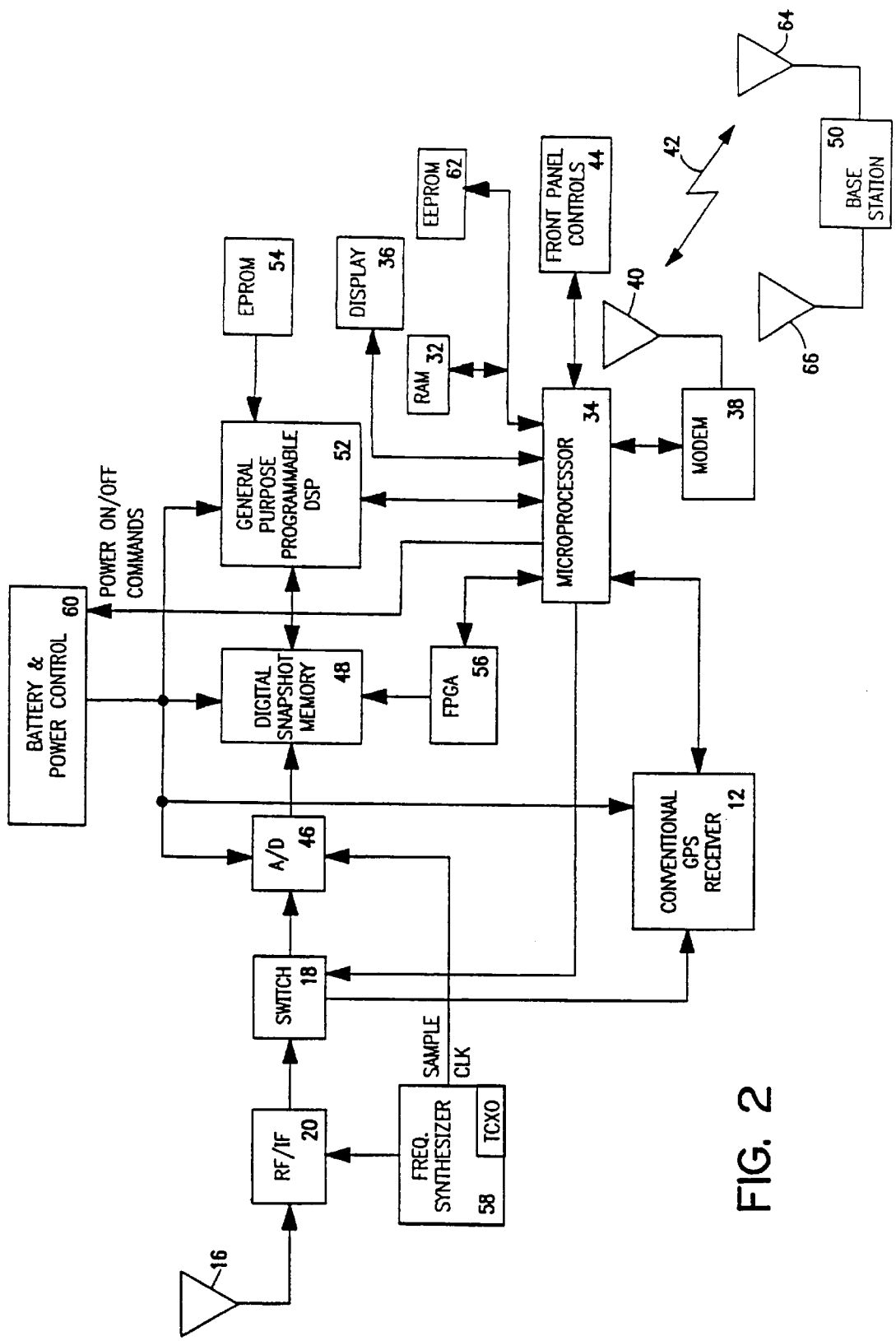
FIG. 2 is a block diagram of an exemplary embodiment of the dual mode GPS receiving system corresponding to FIG. 1C and utilizing the apparatus and methods of the present invention.

Referring now to FIG. 2, one embodiment of GPS receiver 10 (that corresponding to the embodiment illustrated in FIG. 1C) is shown. Although the remaining discussion will be directed primarily to the embodiment illustrated in FIG. 2, it will be apparent to those skilled in the art that the apparatus and methods, including the signal processing functions to be described, may be used in any or all of the embodiments illustrated in FIGS. 1A–1D. For those embodiments, such as the FIG. 1D embodiment, where different circuitry is shared between conventional GPS receiver 12 and snapshot GPS receiver 14, appropriate signal paths would be provided.

Upon power up and initialization, switch 18 is configured to provide a signal path from RF to IF downconverter 20 to conventional GPS receiver 12. Conventional GPS receiver 12 begins to compute pseudoranges using conventional correlation operations as described above. Conventional GPS receiver 12 also receives, decodes and stores satellite ephemeris data received from the in view GPS satellites. In addition, conventional GPS receiver 80 stores Doppler information associated with each of the in view GPS satellites. This Doppler information will typically he in the form of frequency information and can be digitized and stored in RAM 32 under the control of microprocessor 34. The Doppler information will be used by GPS receiver 10 when blockage conditions are encountered as described below. Where available, conventional GPS receiver 12 may use differential GPS (DGPS) correction information transmitted from basestation 50 to assist in determining the position of the GPS receiver 10. The position so determined may be displayed on display 36 as latitude and longitude information, a highlighted map display or another position indication.

Alternatively, for an embodiment which utilizes the Method 3 approach as described above, the pseudorange information computed by conventional GPS receiver 12 can be transmitted to basestation 50 via modem 38 and communication antenna 40 for final position determination. In such an embodiment, the pseudorange information would be transmitted over a communication link 42 from the GPS receiver 10 to the basestation 50. Basestation 50 would be configured with its own GPS receiver, thereby providing a means of obtaining satellite ephemeris information. A processor located at basestation 50 would be provided with information regarding the approximate position of GPS receiver 10 (so that the proper satellite information could he selected) and would combine the ephemeris information with the received pseudoranges to compute the position of the GPS receiver 10. This computed position information could then be transmitted back to GPS receiver 10 via communication link 42 where it would be displayed on display 36.

Under either method, GPS receiver 10 would display the results of a position computation upon receipt of a fix command, i.e., a command to determine the geographic location of GPS receiver 10. The fix command may be provided via a user using front panel controls 44 (or from the basestation 50 when the optional modem 58 and associated communication antenna 40 are used). Upon receipt of the fix command, microprocessor 34 polls conventional GPS receiver 12 for a position report and conventional GPS receiver 12 demodulates the received GPS signals and produces pseudorange information in the conventional fashion as described above.

Under normal operating conditions, i.e., when antenna 16 has a clear view of the sky, conventional GPS receiver 12 is able to accurately acquire and track a sufficient number of GPS satellites to produce pseudorange and/or position information for GPS receiver 10. However, such conditions may rapidly deteriorate when, for example, GPS receiver 10 is moved into an urban or other canyon, inside a building, under a tree or other foliage, or into some other area which results in at least a partial blockage of the sky. Under these conditions, it is likely that conventional GPS receiver 12 will be unable to track a sufficient number of satellites to produce reliable pseudorange and/or position information. The blockage conditions will result in a reduced signal to noise ratio for the GPS signals received by conventional GPS receiver 12 and these reduced signal to noise levels can be used as a trigger for GPS receiver 10 to switch to a "snapshot" mode.

Upon detecting the reduced signal to noise levels of received GPS signals, or under user command entered through front panel controls 44, conventional GPS receiver 12 signals microprocessor 34 that it is encountering a blockage condition. Upon receipt of such a signal, microprocessor 34 configures GPS receiver 10 to operate in the snapshot mode. When the GPS receiver 10 enters the snapshot mode, microprocessor 34 activates switch 18 so as to provide a signal path to the circuitry which makes up snapshot GPS receiver 14. This circuitry includes analog to digital converter (A/D) 46, digital snapshot memory 48, general purpose programmable digital signal processor (DSP) 52, program EPROM 54, field programmable gate array (FPGA) 56, frequency synthesizer 58 (which is also used in conjunction with conventional GPS receiver 12 to provide a local oscillator for RF to IF downconverter 20), battery and power control circuit 60 and microprocessor 34 (which may also control the operations of conventional GPS receiver 12).

While in snapshot mode, when GPS receiver 10 receives a fix command, microprocessor 34 activates A/D converter 46 and digital snapshot memory 48 via the battery and power control circuit 60. This causes signals from the GPS satellites, which are received via antenna 16 and downconverted to an IF frequency in RF to IF downconverter 20, to undergo digitization. That is, the IF signals are sampled by A/D converter 46 at a frequency equal to the sample clock generated by frequency synthesizer 58 and the resulting data is stored in digital snapshot memory 48. A contiguous set of such data, typically corresponds to a duration of 100 milliseconds to 1 second (or even longer). The addressing of digital snapshot memory 48 is controlled by FPGA 56.

Note that all this time (while the snapshot memory 48 is being filled with the digitized GPS signals from the in view satellites) the DSP 52 may be in a low power state. A/D converter 46 need only be turned on for a short period of time, sufficient to collect and store the data required for pseudorange calculation. After the data collection is complete, these converter circuits may be turned off, thus not contributing to additional power dissipation during the actual pseudorange calculation. The pseudorange calculation is then performed using, in one embodiment, a general purpose, programmable digital signal processing integrated circuit (DSP 52), as exemplified by a TMS320C30 integrated circuit from Texas Instruments. DSP 52 is placed in an active power state by the microprocessor 34 via the battery and power control circuit 60 prior to performing such calculations.

This DSP 52 differs from others used in some GPS units in that it is general purpose and programmable, as compared to specialized custom digital signal processing integrated circuits. Furthermore, the DSP 52 makes possible the use of fast convolution algorithms, which permit very rapid computation of the pseudoranges by performing rapidly a large number of convolution operations between a locally generated reference and the received GPS signals. Typically, 2046 such operations are required to complete the search for the epochs of each received GPS signal. The fast convolution algorithms permit a simultaneous and parallel search of all such positions, thus speeding the required computation process by a factor of 10 to 100 over conventional approaches.

Once the DSP 52 has computed the pseudoranges (in the fashion described in detail below), this information may be used to compute the position of GPS receiver 10 using the satellite ephemeris data previously stored by conventional GPS receiver 12. The manner in which such position computations are performed are well known in the art and the resulting position information may be displayed on display 36 as latitude and longitude (and altitude) information, as a highlighted map position or in another useful fashion. The position computations may be performed by microprocessor 34 executing program commands stored in EEPROM 62 or by DSP 52 executing commands stored in Program EPROM 54. The position computations may he made more accurately using DGPS corrections received from basestation 50 or other source of DGPS information (e.g., FM subcarrier broadcasts).

Alternatively, for a Method 3-type embodiment, once the DSP 52 completes its computation of pseudoranges for each of the in view satellites, it may transmit this information to basestation 50 across communication link 42 via modem 38 and under the control of microprocessor 34. At this time the microprocessor 34 may cause the DSP 52 to again enter a low power state by sending an appropriate control signal to the battery and power control circuit 60. In addition to the pseudorange data, a time tag may be simultaneously transmitted to basestation 50. The time tag indicates the elapsed time from the initial data collection in the digital snapshot memory 48 to the time of transmission of the data over the communication link 42. This time tag improves the capability of the basestation 50 to complete the position calculation because it allows the computation of the GPS satellites respective positions at the time of data collection.

Modem 38, in one embodiment, utilizes a separate communication antenna 40 to transmit and receive messages over communication link 42. It will be appreciated that modem 38 includes a communications receiver and a communications transmitter which are alternatively coupled to antenna 42 as required. Similarly, basestation 50 may use a separate antenna 64 to transmit and receive communication link messages, thus allowing continuous reception of GPS signals via GPS antenna 66 at the basestation 50.

As indicated above, the digital snapshot memory 48 captures a record length of data corresponding to a relatively long period of time. The efficient processing of this large block of data using fast convolution methods contributes to the ability of the present invention to process signals at low received levels (e.g., when reception is poor due to partial blockage from buildings, trees, etc.). All pseudoranges for visible GPS satellites are computed using this same buffered data. This provides improved performance relative to continuous tracking (i.e., conventional) GPS receivers in situations (such as urban blockage conditions) in which the signal amplitude is rapidly changing.

Where a communication link 42 is used, GPS receiver 10 may employ an automatic frequency control (AFC) loop to lock to this carrier and thereby further calibrate its own reference oscillator. A message transmission time of 10 msec, with a received signal to noise ratio of 20 dB, will normally allow frequency measurement via an AFC to an accuracy of 10 Hz or better. This will typically be more than adequate for the requirements of the present invention.

In one embodiment, the communication link 42 may be a commercially available narrow bandwidth radio frequency communications medium, such as a two-way pager system. This system may be used in embodiments where the amount of data to be transmitted between the basestation 50 and the GPS receiver 10 is relatively small (e.g., where basestation 50 sends a command to GPS receiver 10 to perform a position fix). In other embodiments, where the amount of data to he transferred between basestation 50 and GPS receiver 10 is relatively large, a higher bandwidth communication link 42 will be required.

Figure 3A:
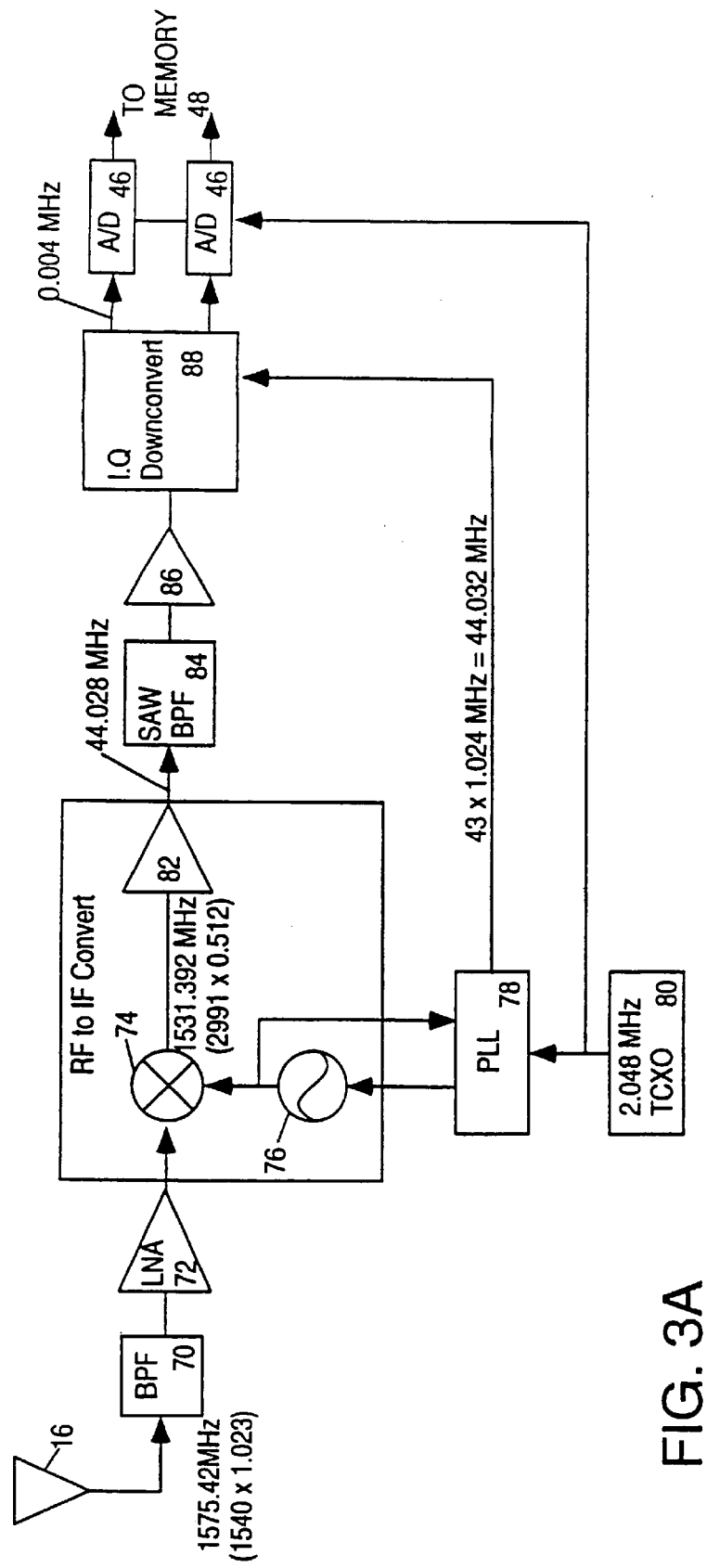
FIGS. 3A and 3B provide two alternatives for the RF and IF portions of the dual mode GPS receiver illustrated in FIG. 2.

A representative example of an RF to IF downconverter 20 and digitizing system for the GPS receiver 10 is shown in FIG. 3A (note that switch 18 has not been shown for sake of clarity). The input signal from antenna 16 at 1575.42 MHz is passed through a bandlimiting filter (BPF) 70 and low noise amplifier (LNA) 72 and sent to a frequency conversion stage. The local oscillator (LO) 76 used in this stage is phase locked (via PLL 78) to a 2.048 MHz (or harmonic thereof) temperature compensated crystal oscillator (TCXO) 80. In a preferred implementation, the LO frequency would be 1531.392 MHz, which is 2991×0.512 MHz. The resulting IF signal is then centered at 44.028 MHz. This IF is desirable due to the availability of low cost components near 44 MHz. In particular, surface acoustic wave filters (SAW), which are utilized in abundance in television applications, are readily available. Of course, other bandlimiting devices could be used instead of SAW devices.

The received GPS signal is mixed with the LO signal in mixer 74 to produce the IF signal. This IF signal is passed through a SAW filter 84, for precision bandlimiting to 2 MHz bandwidth, and then sent to an I/Q down-converter 88, which translates the signal to near baseband (4 kHz center frequency nominally). The local oscillator frequency for this downconverter 88 is derived from the 2.048 MHz TCXO 80 as the 43rd harmonic of 1.024 MHz, that is 44.032 MHz.

The I/Q downconverter 88 is generally commercially available as an RF component. It typically consists of two mixers and lowpass filters. In such instances, the input ports of one mixer are fed with the IF signal and the LO signal and the input ports to the other mixer are fed with the same IF signal and the LO signal phase shifted by 90°. The outputs of the two mixers are lowpass filtered to remove feedthrough and other distortion products.

As shown in FIG. 3A, amplifiers 82 and 86 may he used before and after the bandlimiting operation as required.

The two outputs of the I/Q downconverter 88 are sent to two matched A/D converters 46 which sample the signals at 2.048 MHz. An alternative implementation replaces the A/D converters 46 with comparators (not shown), each of which outputs a two-valued (one-bit) sequence of data in accordance with the polarity of the incoming signal. It is well known that this approach results in a loss of approximately 1.96 dB in receiver sensitivity relative to a multilevel A/D converter. However, there may be substantial cost savings in use of a comparator vs. A/D converters, as well as in the reduced memory requirement in the following digital snapshot memory 48.

Figure 3B:
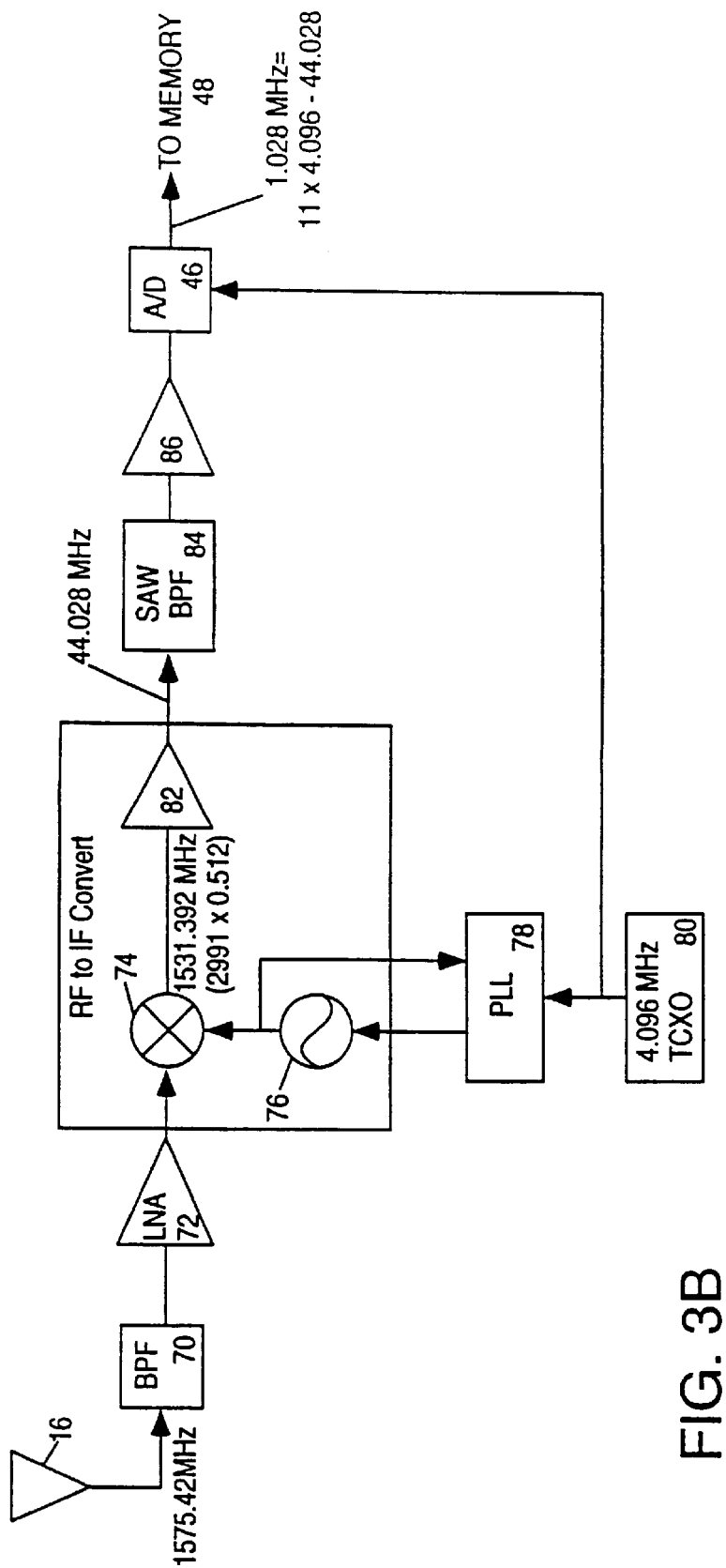

An alternative implementation of the RF to IF downconverter and digitizing system is shown in FIG. 3B which utilizes a bandpass sampling method (again, switch 18 has not been shown). The TCXO 80 employed is at frequency 4.096 MHz (or an harmonic thereof). The TCXO 80 output may be used as the sample clock to the A/D converter 46 (or comparator); this acts to translate the signal to 1.028 MHz. This frequency is the difference between the 11th harmonic of 4.096 MHz and the input IF frequency 44.028 MHz. The resulting 1.028 MHz IF is nearly one-fourth the sample rate, which is known to be nearly ideal in minimizing sampling type distortions. As compared to the I/Q sampling of FIG. 3A, this single sampler provides one channel of data rather than two, but at twice the rate. In addition, the data is effectively at an IF of 1.028 MHz. I/Q frequency conversion to near 0 MHz would then be implemented by digital means in the following processing to be described. The apparatus of FIGS. 3A and 3B are competitive in cost and complexity; often component availability dictates the preferred approach. It will be apparent to those skilled in the art, however, that other receiver configurations could be used to achieve similar results.

In order to simplify the following discussion, the following assumes that the I/Q sampling of FIG. 3A is employed and that the digital snapshot memory 48 contains two channels of digitized data at 2.048 MHz.

Figure 4:
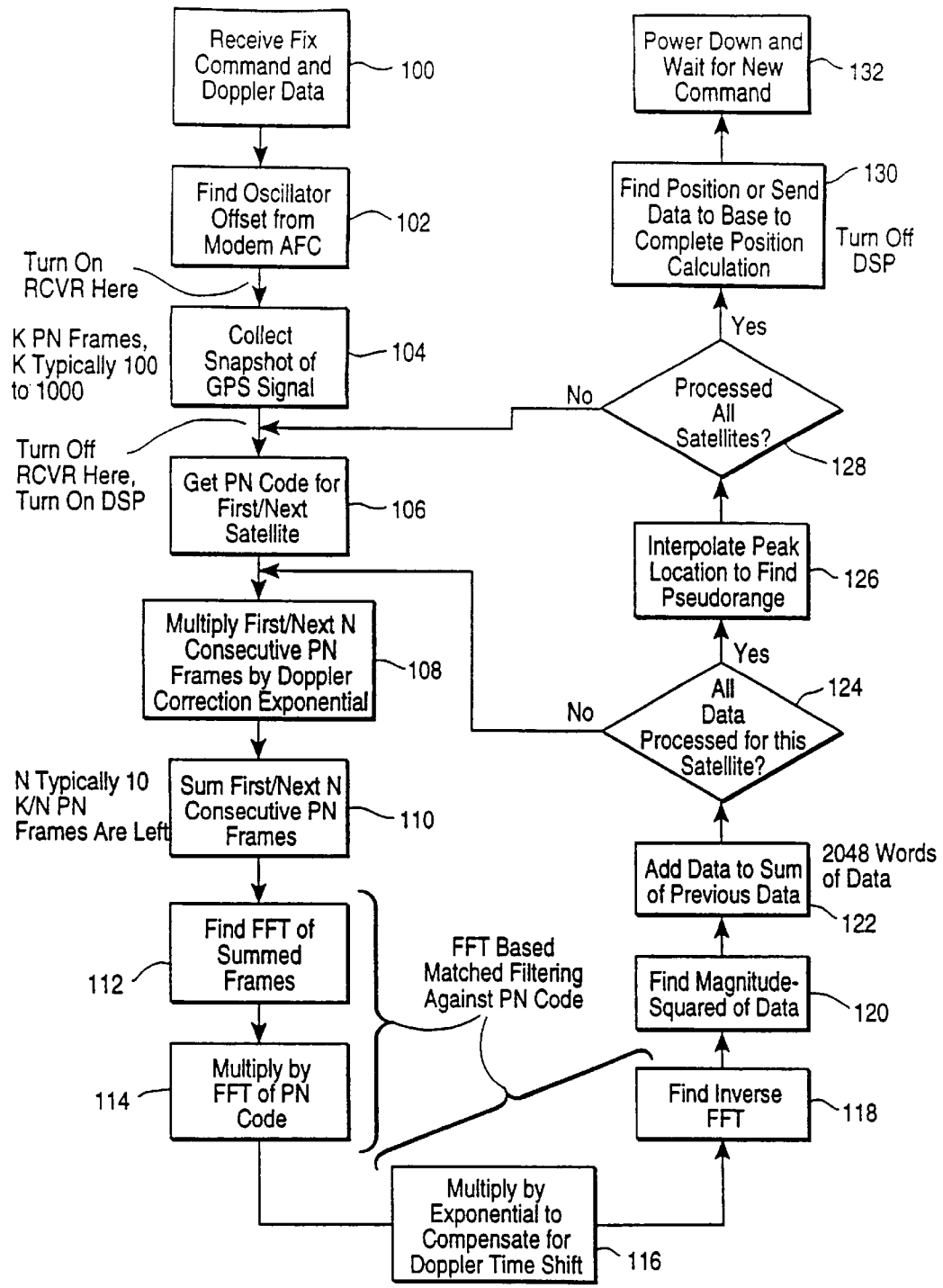
FIG. 4 shows a flowgraph of the major software operations performed by a programmable DSP processor as illustrated in FIG. 2 in accordance with the present invention.

Details of the signal processing performed in the DSP 52 may be understood with the aid of the flowgraph of FIG. 4 and the pictorial of FIGS. 5A–5E. It will be apparent to those skilled in the art that the machine code, or other suitable code, for performing the signal processing to be described may be stored in EPROM 54. Other nonvolatile storage devices could also be used. The objective of the processing is to determine the timing of the received waveform with respect to a locally generated waveform. Furthermore, in order to achieve high sensitivity, a very long portion of such a waveform, typically 100 milliseconds to 1 second, is processed.

In order to understand the processing, one first notes that each received GPS signal (C/A mode) is constructed from a high rate (1 MHz) repetitive pseudorandom (PN) pattern of 1023 symbols, commonly called "chips." These "chips" resemble the waveform shown in FIG. 5A. Further imposed on this pattern is low rate data, transmitted from the satellite at 50 baud. All of this data is received at a very low signal-to-noise ratio as measured in a 2 MHz bandwidth. If the carrier frequency and all data rates were known to great precision, and no data were present, then the signal-to-noise ratio could be greatly improved, and the data greatly reduced, by adding to one another successive frames. For example, there are 1000 PN frames over a period of 1 second. The first such frame could be coherently added to the next frame, the result added to the third frame, etc. The result would be a signal having a duration of 1023 chips. The phasing of this sequence could then be compared to a local reference sequence to determine the relative timing between the two, thus establishing the so-called pseudorange.

The above process must be carried out separately for each satellite in view from the same set of stored received data in the digital snapshot memory 48, since, in general, the GPS signals from different satellites have different Doppler frequencies and the PN patterns differ from one another.

The above process is made difficult by the fact that the carrier frequency may be unknown by in excess of 5 kHz due to signal Doppler uncertainty and by an additional amount due to receiver local oscillator uncertainty. These Doppler uncertainties are removed in one embodiment of the present invention by storing such information in RAM 32 as described above. Alternatively, Doppler information could be transmitted from basestation 50, which simultaneously monitors all GPS signals from in view satellites, in response to a signal via communication link 42 indicating that GPS receiver 10 had entered the snapshot mode. Thus, Doppler search is avoided at the GPS receiver 10. The local oscillator uncertainty can also be greatly reduced (to perhaps 50 Hz) by the aforementioned AFC operation performed using the communication link 42 signal.

The presence of 50 baud data superimposed on the GPS signal still limits the coherent summation of PN frames beyond a period of 20 msec. That is, at most 20 frames may be coherently added before data sign inversions prevent further processing gain. Additional processing gain may be achieved through matched filtering and summation of the magnitudes (or squares of magnitudes) of the frames, as detailed in the following paragraphs.

The flowgraph of FIG. 4 begins at step 100 with a command to initialize a snapshot GPS processing operation (termed a "Fix Command" in FIG. 4). Where necessary (e.g., where no prior Doppler information has been stored by conventional GPS receiver 12), the command includes a transmission from GPS receiver 10 to basestation 50 for Doppler information for the in view satellites to be transmitted from basestation 50 over communication link 42. At step 102, the GPS receiver 10 computes its local oscillator drift, for example, by frequency locking to the signal transmitted from the basestation 50. An alternative would be to utilize a very good quality temperature compensated crystal oscillator (TCXO 80) in the unit. For example, digitally controlled TCXOs, so-called DCXOs, currently can achieve accuracy of about 0.1 parts per million, or an error of about 150 Hz for the L1 GPS signal.

At step 104, microprocessor 34 activates switch 18; turns on power to A/D converters 46 and digital snapshot memory 48; and a snapshot of data of duration K PN frames of the C/A code, where K is typically 100 to 1000 (corresponding to 100 msec to 1 second time duration) is collected. When a sufficient amount of data has been collected, microprocessor 34 turns off the A/D converters 46.

The pseudorange of each satellite is computed in turn as follows. First, at step 106 for the given GPS satellite signal to be processed, the corresponding pseudorandom code (PN) is retrieved from EPROM 54. As discussed shortly, the preferred PN storage format is actually the Fourier transform of this PN code, sampled at a rate of 2048 samples per the 1023 PN bits.

The data in digital snapshot memory 48 is processed in blocks of N consecutive PN frames, that is blocks of 2048N complex samples (N is an integer typically in the range 5 to 10). Similar operations are performed on each block as shown in the bottom loop (steps 108–124) of FIG. 4. That is, this loop is performed a total of K/N times for each GPS signal to be processed.

At step 108 the 2048N data words of the block are multiplied by a complex exponential that removes the effects of Doppler on the signal carrier, as well as the effects of drifting of the receiver local oscillator. To illustrate, suppose the Doppler frequency obtained from conventional GPS receiver 12 (i.e., RAM 32) or the basestation 50 plus local oscillator offsets corresponded to $f_e$ Hz. Then the premultiplication of the data would take the form of the function $e^{-j2\pi f_e nT}$, n=[0, 1, 2, . . . , 2048N−1]+(B−1)×2048N, where T=1/2.048 MHz is the sampling period, and the block number B ranges from 1 to K/N.

Next, at step 110, the adjacent groups of N (typically 10) frames of data within the block are coherently added to one another. That is, samples 0, 2048, 4096, . . . 2048(N−1)−1 are added together, then 1, 2049, 4097, . . . 2048(N−1) are added together, etc. At this point the block contains only 2048 complex samples. An example of the waveform produced by such a summing operation is illustrated in FIG. 5B for the case of 4 PN frames. This summing operation may be considered a preprocessing operation which precedes the fast convolution operations.

Next, at steps 112–118, each of the averaged frames undergoes a matched filtering operation, which purpose is to determine the relative timing between the received PN code contained within the block of data and a locally generated PN reference signal. Simultaneously, the effects of Doppler on the sampling times is also compensated for. These operations are greatly speeded, in one embodiment, by the use of fast convolution operations such as Fast Fourier Transform (FFT) algorithms used in a manner to perform circular convolution, as presently described.

In order to simplify discussion, the above mentioned Doppler compensation is initially neglected.

The basic operation to be performed is a comparison of the data in the block being processed (2048 complex samples) to a similar reference PN block stored locally. The comparison is actually done by (complex) multiplying each element of the data block by the corresponding element or the reference and summing the results. This comparison is termed a "correlation." However, an individual correlation is only done for one particular starting time of the data block, whereas there are 2048 possible positions that might provide a better match. The set of all correlation operations for all possible starting positions is termed a "matched filtering" operation. The full matched filtering operation is required in a preferred embodiment.

The other times of the PN block can he tested by circularly shifting the PN reference and reperforming the same operation. That is, if the PN code is denoted p(0) p(1) . . . p(2047), then a circular shift by one sample is p(1) p(2) . . . p(2047) p(0). This modified sequence tests to determine if the data block contains a PN signal beginning with sample p(1). Similarly the data block may begin with samples p(2), p(3), etc., and each may be tested by circularly shifting the reference PN and reperforming the tests. It should be apparent that a complete set of tests would require 2048×2048= 4,194,304 operations, each requiring a complex multiplication and addition.

A more efficient, mathematically equivalent method may he employed, utilizing the Fast Fourier Transform (FFT), which only requires approximately 12×2048 complex multiplications and twice the number of additions. In this method, the FFT is taken for the data block, at step 112, and for the PN block. The FFT of the data block is multiplied by the complex conjugate of the FFT of the reference, at step 114, and the results are inverse Fourier transformed at step 118. The resulting data so gotten is of length 2048 and contains the set of correlations of the data block and the PN block for all possible positions. Each forward or inverse FFT operation requires $P/2 \log_2 P$ operations, where P is the size of the data being transformed (assuming a radix-2 FFT algorithm is employed). For the case of interest, P=2048, so that each FFT requires 11×1024 complex multiplications. However, if the FFT of the PN sequence is prestored in EPROM 54, as in a preferred embodiment, then its FFT need not be computed during the filtering process. The total number of complex multiplies for the forward FFT, inverse FFT and the product of the FFTs is thus (2×11+2)×1024= 24576, which is a savings of a factor of 171 over direct correlation. FIG. 4C illustrates the waveform produced by this matched filtering operation.

The preferred method of the current invention utilizes a sample rate such that 2048 samples of data were taken over the PN period of 1023 chips. This allows the use of FFT algorithms of length 2048. It is known that FFT algorithms that are a power of 2, or 4, are normally much more efficient than those of other sizes (and $2048=2^{11}$). Hence the sampling rate so chosen significantly improves the processing speed. It is preferable that the number of samples of the FFT equal the number of samples for one PN frame so that proper circular convolution may be achieved. That is, this condition allows the test of the data block against all circularly shifted versions of the PN code, as discussed above. A set of alternative methods, known in the art as "overlap save" or "overlap add" convolution may be utilized if the FFT size is chosen to span a number of samples different from that of one PN frame length. These approaches require approximately twice the number of computations as described above for the preferred implementation.

It should be apparent to one skilled in the art how the above process may be modified by utilizing a variety of FFT algorithms of varying sizes together with a variety of sample rates to provide fast convolution operations. In addition, a set of fast convolution algorithms exist which also have the property that the number of computations required are proportional to $P \log_2 P$ rather than $P^2$ as is required in straightforward correlation. Many of these algorithms are enumerated in standard references, for example, H. J. Nussbaumer, "Fast Fourier Transform and Convolution Algorithms," New York, Springer-Verlag, C1982. Important examples of such algorithms are the Agarwal-Cooley algorithm, the split nesting algorithm, recursive polynomial nesting algorithm, and the Winograd-Fourier algorithm, the first three of which are used to perform convolution and the latter used to perform a Fourier transform. These algorithms may be employed in substitution of the preferred method presented above.

The method of time Doppler compensation employed at step 116 is now explained. In the preferred implementation, the sample rate utilized may not correspond exactly to 2048 samples per PN frame due to Doppler effects on the received GPS signal as well as local oscillator instabilities. For example, it is known that the Doppler shift can contribute a delay error of ±2700 nsec/sec. In order to compensate for this effect, the blocks of data processed in the above description need to be time shifted to compensate for this error. As an example, if the block size processed corresponds to 5 PN frames (5 msec), then the time shift from one block to another could be as much as ±13.5 nsec. Smaller time shifts result from local oscillator instability. These shifts may be compensated for by time shifting the successive blocks of data by multiples of the time shift required by a single block. That is, if the Doppler time shift per block is d, then the blocks are time shifted by nd, where n=0, 1, 2, . . . .

In general these time shifts are fractions of a sample. Performing these operations directly using digital signal processing methods involves the use of nonintegral signal interpolation methods and results in a high computation burden. An alternative approach, that is a preferred method of the present invention, is to incorporate the processing within the fast Fourier transform functions. It is well-known that a time shift of d seconds is equivalent to multiplying the Fourier Transform of a function by $e^{-j2\pi fd}$, where f is the frequency variable. Thus, the time shift may be accomplished by multiplying the FFT of the data block by $e^{-j2\pi nd/T_f}$ for n=0, 1, 2, . . . , 1023 and by $e^{-j2\pi(n-2048)d/T_f}$ for n=1024, 1025, . . . , 2047, where $T_f$ is the PN frame duration (1 millisecond). This compensation adds only about 8%, to the processing time associated with the FFT processing. The compensation is broken into two halves in order to guarantee continuity of phase compensation across 0 Hz.

After the matched filtering operation is complete, the magnitudes, or magnitudes-squared, of the complex numbers of the block are computed at step 120. Either choice will work nearly as well. This operation removes effects of 50 Hz data phase reversals (as shown in FIG. SD) and low frequency carrier errors that remain. The block of 2048 samples is then added to the sum of the previous blocks processed at step 122. Step 122 may be considered a post processing operation which follows the fast convolution operation provided by steps 122–188. This continues until all K/N blocks are processed, as shown by the decision block at step 124, at which time there remains one block of 2048 samples, from which a pseudorange is calculated. FIG. 5E illustrates the resulting waveform after the summing operation.

Pseudorange determination occurs at step 126. A peak is searched for above a locally computed noise level. If such a peak is found, its time of occurrence relative to the beginning of the block represents the pseudorange associated with the particular PN code and the associated GPS satellite.

An interpolation routine is utilized at step 126 to find the location of the peak to an accuracy much greater than that associated with the sample rate (2.048 MHz). The interpolation routine depends upon the prior bandpass filtering used in the RF/IF portion of the GPS receiver 10. A good quality filter will result in a peak having a nearly triangular shape with the width of the base equal to 4 samples. Under this condition, following subtraction of an average amplitude (to remove a DC baseline), the largest two amplitudes may be used to determine the peak position more precisely. Suppose these amplitudes are denoted $A_p$ and $A_{p+1}$, where $A_p \geq A_{p+1}$, without loss of generality, and p is the index of the peak amplitude. Then the position of the peak relative to that corresponding to $A_p$ may be provided by the formula: peak location=$p+A_p/(A_p+A_{p+1})$. For example if $A_p=A_{p+1}$, then the peak location is found to be p+0.5, that is, halfway between the indices of the two samples. In some situations the bandpass filtering may round the peak and a three point polynomial interpolation may be more suitable.

In the preceding processing, a local noise reference used in thresholding may be computed by averaging all the data in the final averaged block, after removing the several largest such peaks.

Once the pseudorange is found, the processing continues at step 128 in a similar manner for the next satellite in view, unless all such satellites have been processed. Upon completion of the processing for all such satellites, the process continues at step 130 where the pseudorange data is transmitted to the basestation 50 over communication link 42, where the final position calculation of the remote is performed (assuming Method 3 is utilized). Alternatively, the position calculation may be performed at GPS receiver 10 using satellite ephemeris data collected by conventional GPS receiver 12 and stored in RAM 32. The computed position may be displayed on display 36 and/or transmitted to basestation 50 over communication link 42. Finally, at step 132, the majority of the snapshot GPS receiver circuitry of the GPS receiver 10 is placed in a low power state, awaiting a new command to perform another positioning operation.

GPS receiver 10 can continue to operate in the snapshot mode, computing pseudoranges and/or positions periodically, until GPS receiver 10 is positioned such that antenna 16 again has a clear view of the sky, at which time conventional GPS receiver 12 can again be used to acquire and track GPS satellites in order to obtain a position fix. In the foregoing embodiment, the processing of GPS signals from each satellite while in the snapshot mode occurs sequentially in time, rather than in parallel. In an alternative embodiment, the GPS signals from all in-view satellites may be processed together in a parallel fashion in time.

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PRN code (similar to a GPS signal) modulated on an L-band carrier signal, generally synchronized with GPS time. Each transmitter may be assigned a unique PRN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

It will be further appreciated that the methods and apparatus of the present invention are equally applicable for use with the GLONASS and other satellite-based positioning systems. The GLONASS system differs from the GPS system in that the emissions from different satellites are differentiated from one another by utilizing slightly different carrier frequencies, rather than utilizing different pseudorandom codes. In this situation, substantially all the circuitry and algorithms described above are applicable, with the exception that when processing a new satellite's emission, a different complex exponential multiplier is used to preprocess the data. The operation may he combined with the Doppler correction operation of step 108 of FIG. 4, without requiring any additional processing operations. Only one PN code is required in this situation, thus eliminating step 106.

In the foregoing specification, the invention has been described with reference to specific exemplary embodiments thereof. It will, however, he evident that various modifications and changes may be made thereto without departing from the broader spirit and scope of the invention as set forth in the appended claims. The specification and drawings are, accordingly, to he regarded in an illustrative rather than a restrictive sense.

What is claimed is:

1. A method in a dual mode receiver having a communication system and a GPS receiver, the method comprising:
   receiving, at the GPS receiver, GPS signals from in view satellites;
   determining pseudorange information for the in view satellites;
   determining, at the dual mode receiver, a position of the GPS receiver from the pseudorange information when the dual mode receiver is in a first mode; and
   transmitting the pseudorange information through the communication system to a remote server for determination of the position of the GPS receiver when the dual mode receiver is in a second mode.

2. The method of claim 1, wherein the method further comprises:
   receiving, through the communication system, the position of the GPS receiver from the remote server when the dual mode receiver is in the second mode.

3. The method of claim 1, wherein the method further comprises:
   receiving, through the communication system, data assisting the GPS receiver to determine the position of the GPS receiver when the dual mode receiver is in the second mode.

4. The method of claim 3, wherein the data received comprises at least one of:
   a) Doppler information for one of the in view satellites;
   b) differential GPS information;
   c) Satellite Data Messages;
   d) identification information for one of the in view satellites;
   e) an approximate location of the GPS receiver; and
   f) ephemeris information for one of the in view satellites.

5. The method of claim 1, wherein the dual mode receiver automatically switches between the first mode and the second mode in response to blockage conditions.

6. The method of claim 5, wherein the blockage conditions are trigged by reduced signal to noise levels of the GPS signals.

7. The method of claim 1, wherein the communication system comprises a cellular telephone.

8. A dual mode receiver, comprising:
   a communication system; and
   a GPS receiver coupled to the communication system, the GPS receiver receiving GPS signals from in view satellites, the GPS receiver determining pseudorange information for the in view satellites, the GPS receiver determining a position of the GPS receiver from the pseudorange information when the dual mode receiver is in a first mode, the communication system transmitting the pseudorange information to a remote server for determination of the position of the GPS receiver when the dual mode receiver is in a second mode.

9. The dual mode receiver of claim 8, wherein the communication system receives the position of the GPS receiver from the remote server when the dual mode receiver is in the second mode.

10. The dual mode receiver of claim 8, wherein the communication system receives data assisting the GPS receiver to determine the position of the GPS receiver when the dual mode receiver is in the second mode.

11. The dual mode receiver of claim 10, wherein the data received comprises at least one of:
   a) Doppler information for one of the in view satellites;
   b) differential GPS information;
   c) Satellite Data Messages;
   d) identification information for one of the in view satellites;
   e) an approximate location of the GPS receiver; and
   f) ephemeris information for one of the in view satellites.

12. The dual mode receiver of claim 10, wherein the dual mode receiver automatically switches between the first mode and the second mode in response to blockage conditions.

13. The dual mode receiver of claim 12, wherein the blockage conditions are trigged by reduced signal to noise levels of the GPS signals.

14. The dual mode receiver of claim 8, wherein the communication system comprises a cellular telephone.

15. A method in a server to transmit non-differential GPS satellite assistance data to a remote dual mode receiver, the method comprising:
   receiving a signal via a communication link from the remote dual mode receiver, the signal indicating a request for the non-differential GPS satellite assistance data which is used in a second mode of processing by the dual mode receiver for processing GPS signals received from in view satellites, the non-differential GPS satellite assistance data being not requested in a first mode of processing by the dual mode receiver; and
   transmitting the non-differential GPS satellite assistance data to the dual mode receiver through the communication link in response to the signal.

16. The method of claim 15, wherein the signal indicates that the dual mode receiver has entered the second mode.

17. The method of claim 16, wherein the communication link comprises a cellular telephone connection.

18. The method of claim 16, wherein the non-differential GPS satellite assistance data comprises Doppler information for one of the in view satellites.

19. The method of claim 16, wherein the non-differential GPS satellite assistance data comprises at least one of:
   a) Satellite Data Messages;
   b) identification information for one of the in view satellites;
   c) an approximate location of the GPS receiver; and
   d) ephemeris information for one of the in view satellites.

20. A server to transmit non-differential GPS satellite assistance data to a remote dual mode receiver, the server comprising:
   means for receiving a signal via a communication link from the remote dual mode receiver, the signal indicating a request for the non-differential GPS satellite assistance data which is used in a second mode of processing by the dual mode receiver for processing GPS signals received from in view satellites, the non-differential GPS satellite assistance data being not requested in a first mode of processing by the dual mode receiver; and
   means for transmitting the non-differential GPS satellite assistance data to the dual mode receiver through the communication link in response to the signal.

21. The server of claim 20, wherein the signal indicates that the dual mode receiver has entered the second mode.

22. The server of claim 21, wherein the communication link comprises a cellular telephone connection.

23. The server of claim 21, wherein the non-differential GPS satellite assistance data comprises Doppler information for one of the in view satellites.

24. The server of claim 21, wherein the non-differential GPS satellite assistance data comprises at least one of:
   a) Satellite Data Messages;
   b) identification information for one of the in view satellites;
   c) an approximate location of the GPS receiver; and
   d) ephemeris information for one of the in view satellites.

25. A method in a dual mode receiver having a communication system and a GPS receiver, the method comprising:
   receiving, at the GPS receiver, GPS signals from in view satellites;
   requesting, via the communication system, assistance data in a second mode of processing the GPS signals, not requesting via the communication system the assistance data in a first mode of processing the GPS signals; and
   determining pseudorange information for the in view satellites from processing the GPS signals.

26. The method of claim 25, further comprising:
   receiving, via the communication system, the assistance data in the second mode of processing the GPS signals;
   wherein the assistance data received via the communication system is used to determine the pseudorange information in the second mode of processing the GPS signal; and
   wherein no assistance data received via the communication system is used to determine the pseudorange information in the first mode of processing the GPS signal.

27. The method of claim 26, wherein the communication system comprises a cellular telephone.

28. The method of claim 26, wherein the assistance data comprises non-differential GPS satellite assistance data.

29. The method of claim 28, wherein the non-differential GPS satellite assistance data comprises Doppler information for one of the in view satellites.

30. The method of claim 28, wherein the non-differential GPS satellite assistance data comprises at least one of:
   a) Satellite Data Messages;
   b) identification information for one of the in view satellites;
   c) an approximate location of the GPS receiver; and
   d) ephemeris information for one of the in view satellites.

31. A dual mode receiver, comprising:
   a communication system; and
   a GPS receiver coupled to the communication system, the GPS receiver receiving GPS signals from in view satellites, the communication system requesting satellite assistance data in a second mode of processing the GPS signals, the communication system not requesting the assistance data in a first mode of processing the GPS signals, the GPS receiver determining pseudorange information for the in view satellites from processing the GPS signals.

32. The dual mode receiver of claim 31, wherein:
   the communication system receives the satellite assistance data in the second mode of processing the GPS signals;
   the assistance data received via the communication system is used to determine the pseudorange information in the second mode of processing the GPS signal; and no assistance data received via the communication system is used to determine the pseudorange information in the first mode of processing the GPS signal.

33. The dual mode receiver of claim 31, wherein the communication system comprises a cellular telephone.

34. The dual mode receiver of claim 31, wherein the assistance data comprises non-differential GPS satellite assistance data.

35. The dual mode receiver of claim 34, wherein the non-differential GPS satellite assistance data comprises Doppler information for one of the in view satellites.

36. The dual mode receiver of claim 34, wherein the non-differential GPS satellite assistance data comprises at least one of:

a) Satellite Data Messages;
b) identification information for one of the in view satellites;
c) an approximate location of the GPS receiver; and
d) ephemeris information for one of the in view satellites.

* * * * *